US010488901B1

(12) United States Patent
Locke et al.

(10) Patent No.: US 10,488,901 B1
(45) Date of Patent: Nov. 26, 2019

(54) DYNAMIC THERMAL RESPONSES FOR COMPUTING COMPONENTS

(71) Applicant: Dell Products L.P., Round Rock, TX (US)

(72) Inventors: Kevin B. Locke, Georgetown, TX (US); Jian Xin Guo, Austin, TX (US); Yuan David Ma, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/136,824

(22) Filed: Sep. 20, 2018

(51) Int. Cl.
*G06F 1/20* (2006.01)
*H05K 7/20* (2006.01)

(52) U.S. Cl.
CPC ......... *G06F 1/206* (2013.01); *H05K 7/20136* (2013.01); *H05K 7/20209* (2013.01)

(58) Field of Classification Search
None
See application file for complete search history.

(56) References Cited

U.S. PATENT DOCUMENTS

| | | | | |
|---|---|---|---|---|
| 2003/0216882 A1* | 11/2003 | Lai | ............................ | G06F 1/20 702/132 |
| 2007/0296408 A1* | 12/2007 | Liao | .................. | G05D 23/1931 324/224 |
| 2008/0034232 A1* | 2/2008 | Rangarajan | ............. | G06F 1/206 713/300 |
| 2010/0085196 A1* | 4/2010 | Stiver | ................ | H05K 7/20836 340/584 |
| 2014/0092549 A1* | 4/2014 | Kodama | ............ | H05K 7/20745 361/679.48 |
| 2014/0121854 A1* | 5/2014 | Conroy | ..................... | G06F 1/26 700/300 |
| 2014/0142764 A1* | 5/2014 | Chen | .................. | H05K 7/20209 700/276 |
| 2016/0274629 A1* | 9/2016 | Lovicott | ................ | G06F 1/206 |

* cited by examiner

*Primary Examiner* — Jason Lin
(74) *Attorney, Agent, or Firm* — Baker Botts L.L.P.

(57) ABSTRACT

Methods, systems, and computer programs encoded on computer storage medium, for detecting a throttling of a component; identifying a temperature of the component; calculating a thermal response for the component, including: setting the identified temperature as a maximum temperature, setting a first temperature lower than the maximum temperature, wherein for temperatures of the component less than the first temperature, the cooling fan system has a first fan speed, setting a second temperature between the first and the maximum temperature, wherein for temperatures of the component between the first and the second temperatures, a fan speed of the cooling fan system is linearly increased until an acoustic fan speed, setting a third temperature between the second and the maximum temperature, wherein for temperatures of the component between the second and third temperatures, maintaining the fan speed at the acoustic fan speed; applying the thermal response to the component.

20 Claims, 5 Drawing Sheets

US 10,488,901 B1

DYNAMIC THERMAL RESPONSES FOR COMPUTING COMPONENTS

BACKGROUND

Field of the Disclosure

The disclosure relates generally to information handling systems, and, more particularly, to a system and method for configuring dynamic thermal responses for computing components.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Innovative aspects of the subject matter described in this specification may be embodied in methods that includes identifying a computing device including at least one computing component and a cooling fan system; detecting, by a thermal response module, a throttling of the computing component; in response to detecting the throttling of the computing component: identifying, by the thermal response module, a temperature of the computing component at a time of the throttling; calculating, by the thermal response module, a thermal response for the computing component, including: setting the identified temperature as a maximum temperature, setting a first temperature lower than the maximum temperature, wherein for temperatures of the computing component less than the first temperature, the cooling fan system has a first fan speed, setting a second temperature between the first temperature and the maximum temperature, wherein for temperatures of the computing component between the first and the second temperatures, a fan speed of the cooling fan system is linearly increased until an acoustic fan speed, setting a third temperature between the second temperature and the maximum temperature, wherein for temperatures of the computing component between the second and third temperatures, maintaining the fan speed at the acoustic fan speed, and wherein for temperatures of the computing component greater than the third temperature, increasing the fan speed of the cooling system greater than the acoustic fan speed; applying, by the thermal response module, the thermal response to the computing component.

Other embodiments of these aspects include corresponding system, apparatus, and computer programs, configured to perform the actions of the methods, encoded on computer storage devices.

These and other embodiments may each optionally include one or more of the following features. For instance, after applying the thermal response to the computing component: detecting, by the thermal response module, a further throttling of the computing component; in response to detecting the further throttling of the computing component: identifying, by the thermal response module, a further temperature of the computing component at a time of the further throttling; calculating, by the thermal response module, a further thermal response for the computing component, including: setting the identified further temperature as a further maximum temperature, setting a further first temperature lower than the maximum temperature, wherein for temperatures of the computing component less than the further first temperature, the cooling fan system has the first fan speed, wherein the further first temperature is lower than the first temperature, setting a further second temperature between the further first temperature and the further maximum temperature, wherein for temperatures of the computing component between the further first and the further second temperatures, the fan speed of the cooling fan system is linearly increased until the acoustic fan speed, wherein the further second temperature is lower than the second temperature, setting a further third temperature between the further second temperature and the further maximum temperature, wherein for temperatures of the computing component between the further second and further third temperatures, maintaining the fan speed at the acoustic fan speed, wherein the further third temperature is lower than the third temperature, and wherein for temperatures of the computing component greater than the further third temperature, increasing the fan speed of the cooling system greater than the acoustic fan speed; applying, by the thermal response module, the further thermal response to the computing component.

After applying the thermal response to the computing component, ceasing to detect, by the thermal response module, a further throttling of the computing component within a time period. The first fan speed is an idle fan speed. The acoustic fan speed is based on acoustics of the computing device. Identifying the temperature of the computing component includes: providing, by the thermal response module to the computing component, a query of the temperature of the computing component; and in response to the query, receiving, by the thermal response module and from the computing component, the temperature of the computing component. Identifying the temperature of the computing component includes receiving, from one or more sensors proximate to the computing component, the temperature of the computing component.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
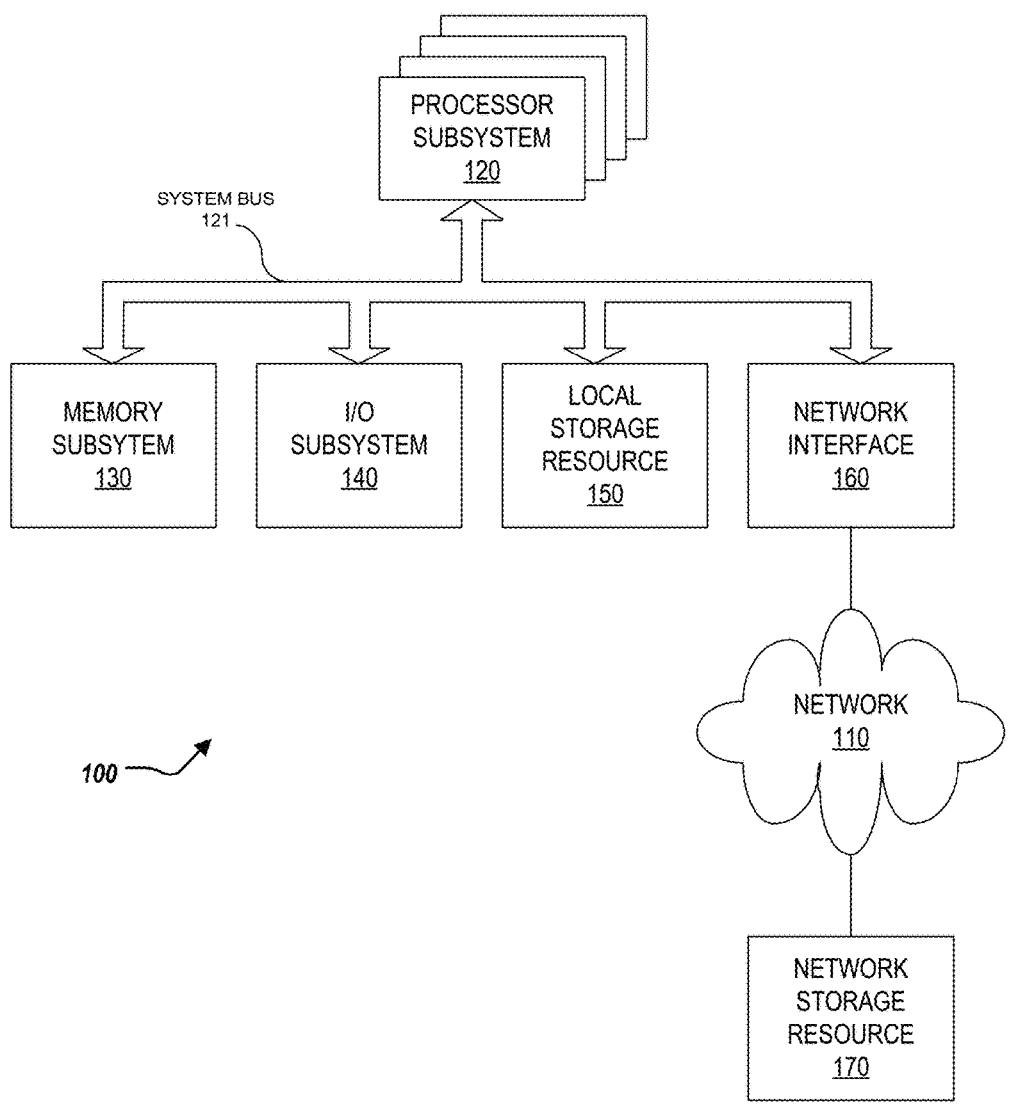
FIG. 1 is a block diagram of selected elements of an embodiment of an information handling system.

This document describes methods, systems, and computer readable medium for configuring a dynamic thermal response that is to applied to computing components—by a cooling fan system—to provide adequate cooling to the components while concurrently optimizing acoustics of the cooling fan system. Specifically, for components installed in a desktop computing environment or server chassis environment, the ability to limit the thermal throttle or shutdown due to an overheat condition is desired. Often, computing components of the environments are updated and released by manufacturers at a pace that does not allow updates to occur to the primary system. Additionally, some computing environments may not be designed to support specifically designed computing components, for example, computing components for a particular industry. In addition, the cooling fan system can age over time and become less efficient. Thus, the end user can be left with a computing component that can overheat. To that end, the present document describes a dynamic thermal response that can be stored across power cycles. For example, when the same component and location are found on subsequent boots, the stored thermal response can be used to prevent thermal throttling conditions of the computing components.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-5 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
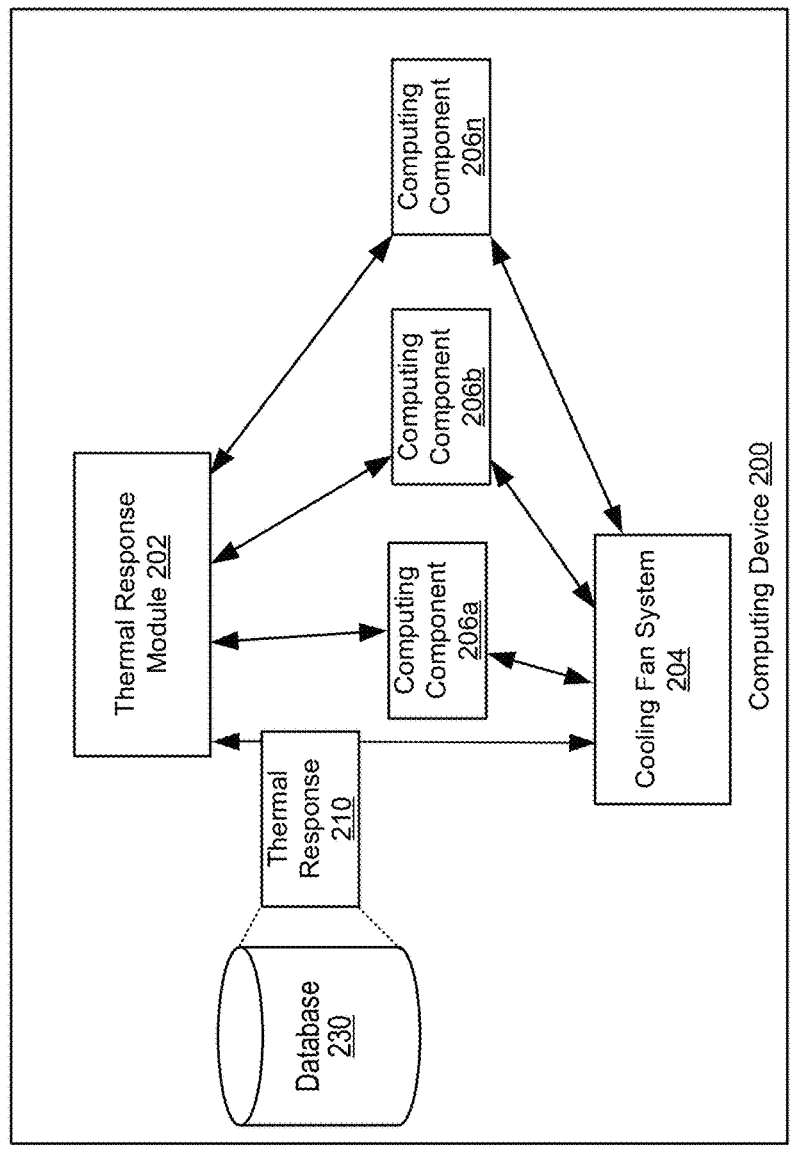
FIG. 2 illustrates a computing device for configuring a dynamic thermal response.

Turning now to FIG. 2, FIG. 2 depicts a computing device 200. The computing device 200 includes a thermal response module 202, a cooling fan system 204, computing components 206a, 206b, . . . , 206n (referred to as computing components 206), and a database 230. The thermal response module 202 can correspond to the information handling system 100 of FIG. 1. The thermal response module 202 can be in communication with the cooling fan system 204, the components 206, and the database 230 over one or more networks (not shown). The cooling fan system 204 can be in communication with the components 206 over one or more networks (not shown). The components 206 can include PCIe cards, such as graphics cards. Each of the components 206 can include a specific set of thermal specifications.

The thermal response module 202, in short, can configure a dynamic thermal response that is to applied to the components—by the cooling fan system 204—to provide adequate cooling to the components while concurrently optimizing acoustics of the cooling fan system 204. Specifically, the thermal response module 202 can detect a throttling of the computing component 206. In some examples, the throttling of the computing component 206 can include a performance throttling, and/or a shutdown of the computing component 206. In some examples, the thermal response module 202 receives data from the computing component 206 indicating throttling of the computing component 206. In some examples, the thermal response module 202 detects the throttling of the computing component 206 based on explicit or implicit detection of the throttling of the computing component 206. In some examples, throttling of the computing component 206 can include when a performance metric associated with the computing component 206 is below a threshold, and the thermal response module 206 detects the throttling in response to such performance metric being below the threshold.

The thermal response module 202, in response to detecting the throttling of the computing component 206, i) identifies a temperature of the computing component 206 at a time of the throttling and ii) calculates a thermal response for the computing component 206. Specifically, when the thermal response module 202 detects the throttling of the computing component 206, the thermal response module 202 can store the temperature of the computing component 206 (e.g., in a data store). In some examples, the thermal response module 202 provides a query of the temperature of the computing component 206 to the computing component 206 at the time of detection of throttling (or proximate to the time of detection of throttling). The thermal response module 202 receives, in response to the query and from the computing component 206, the temperature of the computing component 206 at the time of detection of throttling (or proximate to the time of detection of throttling).

In some examples, the computing component 206 is unable to provide the temperature of itself to the thermal response module 202 (e.g., during shutdown, or other circumstances). When such occurs, the thermal response module 202 can store, or provide access to a data store, of a temperature associated with the computing component 206 during throttling—e.g., as provided by data sheets of the computing component 206 generated by a manufacturer of the computing component 206. A user can enter such throttling temperatures manually during boot or run time, and have it stored in non-volatile memory. In some examples, each of the computing components 206 can include a same temperature when throttling is detected, or each can include a differing temperature when throttling is detected.

In some examples, the thermal response module 202 can receive, from sensors (not shown) proximate to the computing component 206, the temperature of the computing component 206 at the time of the throttling of the computing component 206. The sensors can be included next to each computing component 206 and/or positioned throughout the computing device (e.g., ambient sensors).

The thermal response module 202 can calculate a thermal response 210 for the computing component 206. Broadly, calculating the thermal response 210 can include setting different temperature thresholds of the thermal response, and assigning differing fan speed levels of the cooling fan system 204 accordingly. In some examples, the thermal response module 202 can calculate the thermal response 210 using (unsupervised) machine learning. In short, the thermal response module 202 can, in response to detecting the throttling of the computing component 206, detect the temperature of the computing component 206 at which the computing component 206 experiences throttling, dynamically adjusting the thermal response 210 for the computing component 206, and apply the thermal response 210 to the computing component 206 to avoid future throttling of the computing component 206.

Specifically, calculating the thermal response 210 can include, setting, by the thermal response module 202, the identified temperature of the computing component 206 at which the computing component 206 experiences throttling as a maximum temperature. This maximum temperature can be considered as the maximum allowable temperature of the computing component 206. The thermal response module 202 can set a first temperature lower than the maximum temperature such that for temperatures of the computing component 206 less than the first temperature, the cooling fan system 204 has a first fan speed. In some examples, the first fan speed is an idle fan speed. The idle fan speed can be determined by acoustic testing of the computing device 202 (e.g., the enclosure that includes the computing device 202). In some examples, the idle fan speed can be zero revolutions per minute (RPM). The thermal response module 202 can set a second temperature between the first temperature and the maximum temperature such that for temperatures of the computing component 206 between the first and second temperatures, the fan speed of the cooling fan system 204 is linearly increased until an acoustic fan speed. That is, the acoustic fan speed is based on acoustics of the computing device 202 (e.g., the enclosure that includes the computing device 202). The thermal response module 202 can set a third temperature between the second temperature and the maximum temperature such that for temperatures of the computing component 206 between the second and the third temperatures, the fan speed of the cooling fan system 204 is maintained at the acoustic fan speed. And lastly, for temperatures greater than the third temperature, the fan speed of the cooling fan system 202 is increased greater than the acoustic fan speed. In some examples, the fan speed of the cooling fan system 202 is increased until the temperature of the computing component 206 is at or below the maximum temperature. In some examples, the fan speed of the cooling fan system 202 is increased until the temperature of the computing component 206 is at or below the third temperature.

The thermal response module 202 can apply the thermal response 210 to the computing component 206. That is, the thermal response module 202 can instruct the cooling fan system 204 to apply the thermal response 210 to the computing component 206, and specifically, apply cooling to the computing component 206 based on the thermal response 210. In some examples, the thermal response module 202 stores the thermal response 210 in the database 230.

In some examples, after applying the thermal response 210 to the computing component 206, the thermal response module 202 ceases to detect any further throttling of the computing component 206 (e.g., within a specified time period).

Figure 3:
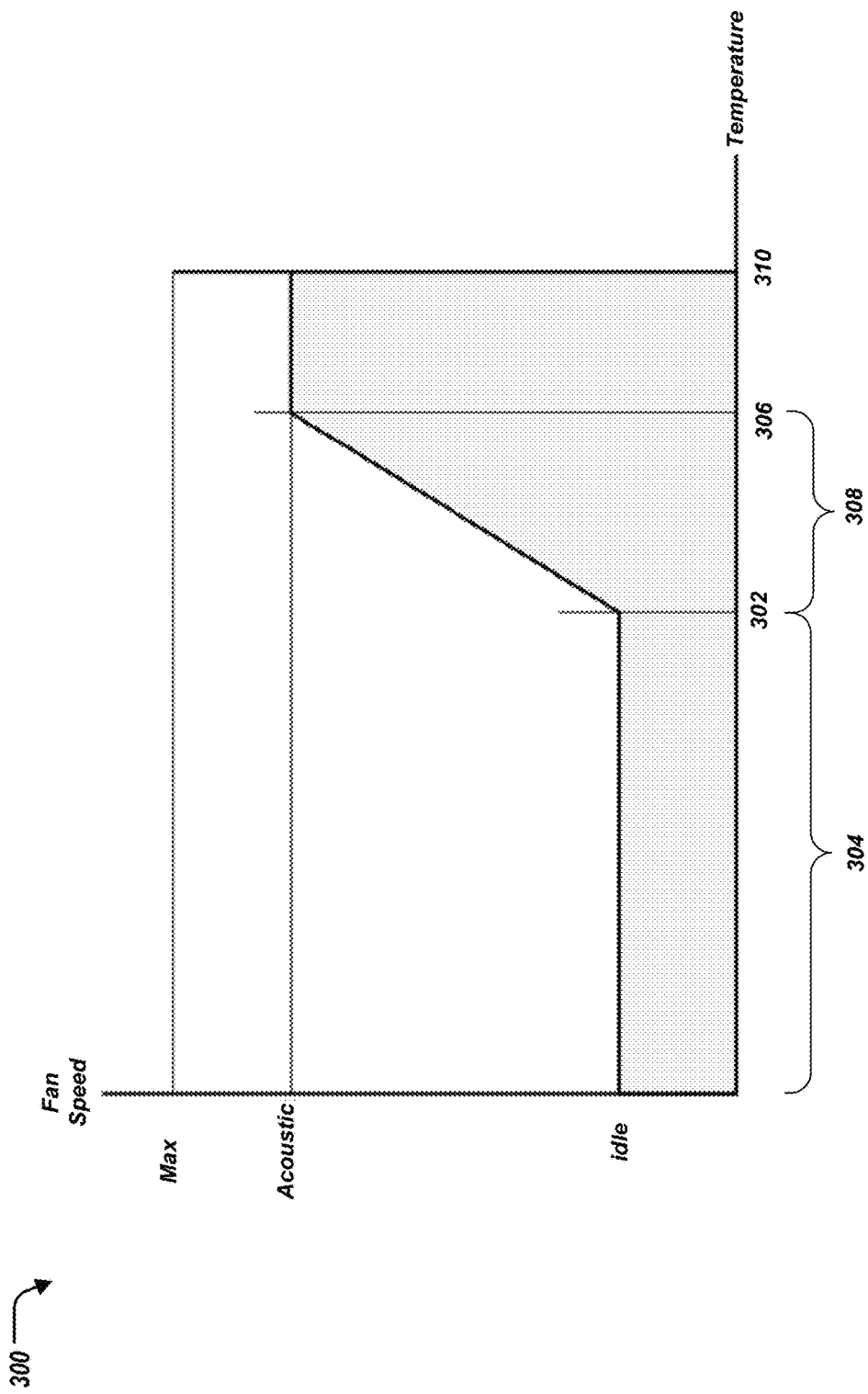
FIGS. 3 and 4 illustrate example thermal responses.

FIG. 3 illustrates a graph illustrating an example of a thermal response 300, similar to the thermal response 210. The temperature values are determined using the method described herein. The thermal response 300, for a particular computing component (e.g., computing component 206), can include a maximum temperature of 90 degrees Celsius. The first temperature 302 of the thermal response 300 can be set 15 degrees less than the maximum temperature, that is, 75 degrees Celsius. For temperatures less than the first temperature 302, shown by a range 304, the first fan speed (e.g., of the cooling fan system 204) is 1000 rpm. The second temperature 306 of the thermal response 300 can be set 5 degrees less than the maximum temperature, that is, 85 degrees. For temperatures between the first temperature 302 (75 degrees Celsius) and the second temperature 306 (85 degrees Celsius), shown by a range 308, the fan speed (e.g., of the cooling fan system 204) is linearly increased until an acoustic fan speed of 4000 rpm is reached. The third temperature 310 of the thermal response 300 can be set 2 degrees less than the maximum temperature, that is, 88 degrees Celsius. For temperatures between the second temperature 306 (85 degrees Celsius) and the third temperature 310 (88 degrees Celsius), shown by range 312, the fan speed (e.g., of the cooling fan system 204) is maintained at the acoustic fan speed of 4000 rpm. For temperatures greater than the third temperature 310, the fan speed can be increased greater than the acoustic fan speed of 4000 rpm.

Figure 4:
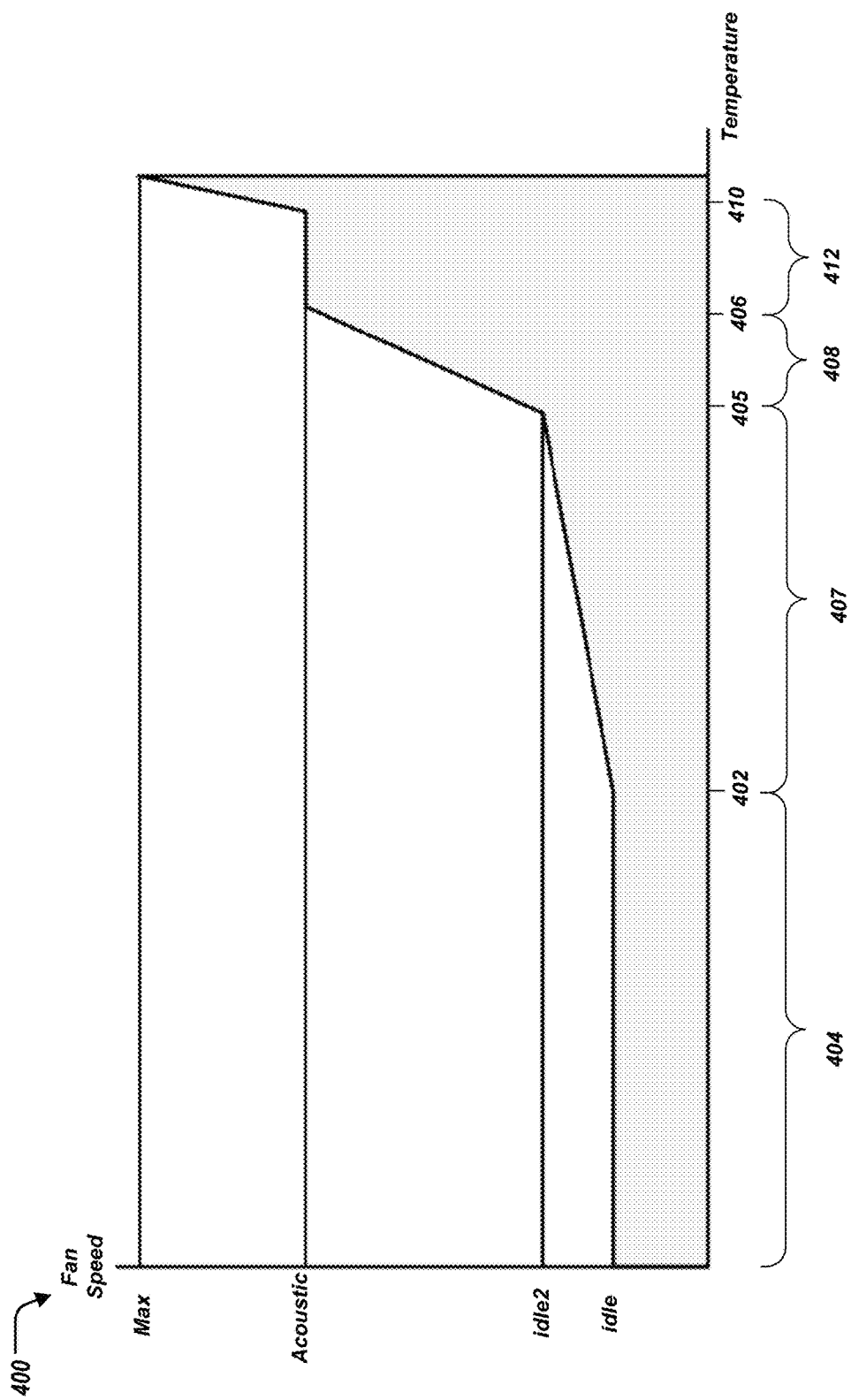

FIG. 4 illustrates a graph illustrating an example of a thermal response 400, similar to the thermal response 210. The temperature values are determined using the method described herein. In some examples, for temperatures less than first temperature, the first fan speed can include one or more ranges and corresponding fan speeds. Specifically, the thermal response 400, for a particular computing component (e.g., computing component 206), can include a maximum temperature of 90 degrees Celsius. The first temperature 402 of the thermal response 300 can be set 20 degrees less than the maximum temperature, that is, 70 degrees Celsius. For temperatures less than the first temperature 402, shown by a range 404, the first fan speed (e.g., of the cooling fan system 204) is 500 rpm. An additional temperature 405 of the thermal response 300 can be set 9 degrees less than the maximum temperature, that is, 81 degrees. For temperatures between the first temperature 402 (75 degrees Celsius) and the additional temperature 405 (81 degrees Celsius), shown by a range 407, the fan speed (e.g., of the cooling fan system 204) is linearly increased until a second (command) fan speed of 2000 rpm is reached. A second temperature 406 of the thermal response 300 can be set 5 degrees less than the maximum temperature, that is, 85 degrees. For temperatures between the additional temperature 405 (81 degrees Celsius) and the second temperature 406 (85 degrees Celsius), shown by a range 408, the fan speed (e.g., of the cooling fan system 204) is linearly increased until an acoustic fan speed of 8000 rpm is reached. A third temperature 410 of the thermal response 300 can be set 2 degrees less than the maximum temperature, that is, 88 degrees Celsius. For temperatures between the second temperature 406 (85 degrees Celsius) and the third temperature 410 (88 degrees Celsius), shown by range 412, the fan speed (e.g., of the cooling fan system 204) is maintained at the acoustic fan speed of 8000 rpm. For temperatures greater than the third temperature 410, the fan speed can be increased greater than the acoustic fan speed of 8000 rpm. For example, the fan speed (e.g., of the cooling fan system 204) can be increased until a maximum fan speed of 12,000 rpm to attempt to maintain the temperature of the computing component 206 less than the maximum temperature of 90 degrees Celsius.

In some examples, after applying the thermal response to the computing component 206, the thermal response module 202 can detect a further throttling of the computing component 206. The thermal response module 202, in response to detecting the further throttling of the computing component 206, i) identifies a further temperature of the computing component 206 at a time of the further throttling and ii) calculates a further thermal response for the computing component 206. Specifically, calculating the further thermal response can include, setting, by the thermal response module 202, the identified further temperature of the computing component 206 at which the computing component 206 experiences throttling as a further maximum temperature. This further maximum temperature can be considered as the maximum allowable temperature of the computing component 206. The further maximum temperature can be lower than the maximum temperature.

The thermal response module 202 can set a further first temperature lower than the maximum temperature such that for temperatures of the computing component 206 less than the further first temperature, the cooling fan system 204 has a first fan speed. The further first temperature is lower than the first temperature. The thermal response module 202 can set a second further temperature between the first temperature and the further maximum temperature such that for temperatures of the computing component 206 between the further first and further second temperatures, the fan speed of the cooling fan system 204 is linearly increased until the acoustic fan speed. The further second temperature is lower than the second temperature. The thermal response module 202 can set a third further temperature between the second temperature and the further maximum temperature such that for temperatures of the computing component 206 between the further second and the further third temperatures, the fan speed of the cooling fan system 205 is maintained at the acoustic fan speed. The further third temperature is lower than the third temperature. And lastly, for temperatures greater than the further third temperature, the fan speed of the cooling fan system 202 is increased greater than the acoustic fan speed. In some examples, the fan speed of the cooling fan system 202 is increased until the temperature of the computing component 206 is at or below the further maximum temperature. In some examples, the fan speed of the cooling fan system 202 is increased until the temperature of the computing component 206 is at or below the further third temperature.

The thermal response module 202 can apply the further thermal response to the computing component 206. That is, the thermal response module 202 can instruct the cooling fan system 204 to apply the further thermal response to the computing component 206, and specifically, apply cooling to the computing component 206 based on the further thermal response. In some examples, the thermal response module 202 stores the further thermal response in the database 230. In some examples, after applying the further thermal response to the computing component 206, the thermal response module 202 ceases to detect any further throttling of the computing component 206 (e.g., within a specified time period).

In some examples, the thermal response module 202 repeats determining further thermal responses until the computing component 206 cease throttling. In some examples, the thermal response module 202 lowers the maximum temperature and repeats determining further thermal response until the computing component 206 ceases throttling.

Figure 5:
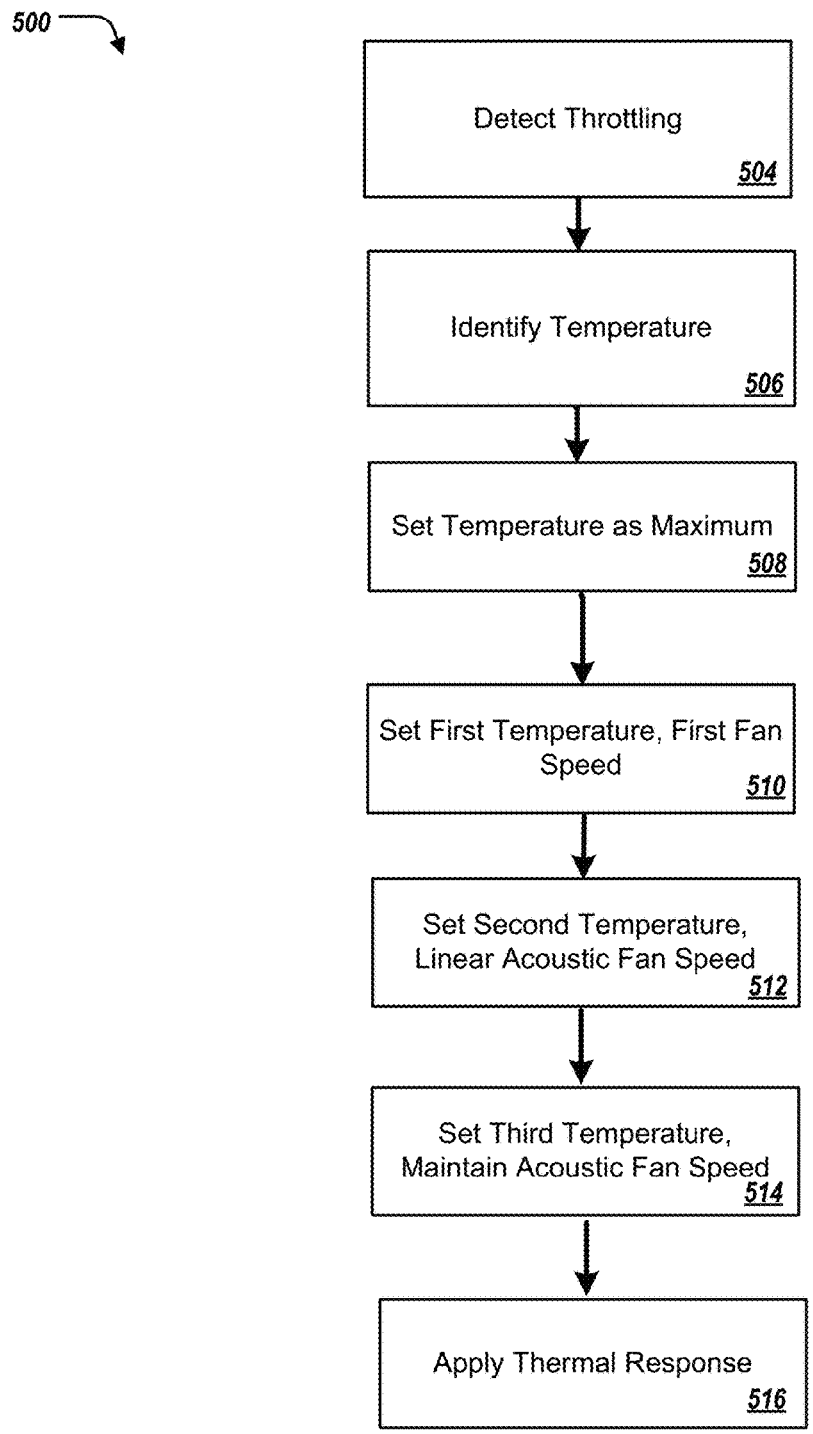
FIG. 5 illustrates a flowchart for configuring a dynamic thermal response.

FIG. 5 illustrates a flowchart depicting selected elements of an embodiment of a method 500 for configuring a dynamic thermal response. The method 500 may be performed by the information handling system 100, the computing device 200, and/or the thermal response module 202 described herein with reference to FIGS. 1 and 2, or another information handling system. It is noted that certain operations described in method 500 may be optional or may be rearranged in different embodiments.

The thermal response module 202 can detect a throttling of the computing component 206 (504). The thermal response module 202, in response to detecting the throttling of the computing component 206, i) identifies a temperature of the computing component 206 at a time of the throttling (506). The thermal response module 202 sets the identified temperature of the computing component 206 at which the computing component 206 experiences throttling as a maximum temperature (508). This maximum temperature can be considered as the maximum allowable temperature of the computing component 206. The thermal response module 202 can set a first temperature lower than the maximum temperature such that for temperatures of the computing component 206 less than the first temperature, the cooling fan system 204 has a first fan speed (510). The thermal response module 202 can set a second temperature between the first temperature and the maximum temperature such that for temperatures of the computing component 206 between the first and second temperatures, the fan speed of the cooling fan system 204 is linearly increased until an acoustic fan speed (512). The thermal response module 202 can set a third temperature between the second temperature and the maximum temperature such that for temperatures of the computing component 206 between the second and the third temperatures, the fan speed of the cooling fan system 204 is maintained at the acoustic fan speed (514). And for temperatures greater than the third temperature, the fan speed of the cooling fan system 202 is increased greater than the acoustic fan speed. The thermal response module 202 can apply the thermal response 210 to the computing component 206 (516). That is, the thermal response module 202 can instruct the cooling fan system 204 to apply the thermal response 210 to the computing component 206, and specifically, apply cooling to the computing component 206 based on the thermal response 210.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A computer-implemented method, comprising:
    identifying a computing device including at least one computing component and a cooling fan system;
    detecting, by a thermal response module, a throttling of the computing component;
    in response to detecting the throttling of the computing component:
        identifying, by the thermal response module, a temperature of the computing component at a time of the throttling;
        calculating, by the thermal response module, a thermal response for the computing component, including:
            setting the identified temperature as a maximum temperature,
            setting a first temperature lower than the maximum temperature, wherein for temperatures of the computing component less than the first temperature, the cooling fan system has a first fan speed,
            setting a second temperature between the first temperature and the maximum temperature, wherein for temperatures of the computing component between the first and the second temperatures, a fan speed of the cooling fan system is linearly increased until an acoustic fan speed,
            setting a third temperature between the second temperature and the maximum temperature, wherein for temperatures of the computing component between the second and third temperatures, maintaining the fan speed at the acoustic fan speed, and wherein for temperatures of the computing component greater than the third temperature, increasing the fan speed of the cooling system greater than the acoustic fan speed;
    applying, by the thermal response module, the thermal response to the computing component.

2. The computer-implemented method of claim 1, further comprising:
    after applying the thermal response to the computing component:
    detecting, by the thermal response module, a further throttling of the computing component;
    in response to detecting the further throttling of the computing component:
        identifying, by the thermal response module, a further temperature of the computing component at a time of the further throttling;
        calculating, by the thermal response module, a further thermal response for the computing component, including:
            setting the identified further temperature as a further maximum temperature,
            setting a further first temperature lower than the maximum temperature, wherein for temperatures of the computing component less than the further first temperature, the cooling fan system has the first fan speed, wherein the further first temperature is lower than the first temperature,
            setting a further second temperature between the further first temperature and the further maximum temperature, wherein for temperatures of the computing component between the further first and the further second temperatures, the fan speed of the cooling fan system is linearly increased until the acoustic fan speed, wherein the further second temperature is lower than the second temperature,
            setting a further third temperature between the further second temperature and the further maximum temperature, wherein for temperatures of the computing component between the further second and further third temperatures, maintaining the fan speed at the acoustic fan speed, wherein the further third temperature is lower than the third temperature, and wherein for temperatures of the computing component greater than the further third temperature, increasing the fan speed of the cooling system greater than the acoustic fan speed;
    applying, by the thermal response module, the further thermal response to the computing component.

3. The computer-implemented method of claim 1, after applying the thermal response to the computing component, ceasing to detect, by the thermal response module, a further throttling of the computing component within a time period.

4. The computer-implemented method of claim 1, wherein the first fan speed is an idle fan speed.

5. The computer-implemented method of claim 1, wherein the acoustic fan speed is based on acoustics of the computing device.

6. The computer-implemented method of claim 1, wherein identifying the temperature of the computing component includes:
    providing, by the thermal response module to the computing component, a query of the temperature of the computing component; and in response to the query, receiving, by the thermal response module and from the computing component, the temperature of the computing component.

7. The computer-implemented method of claim 1, wherein identifying the temperature of the computing component includes receiving, from one or more sensors provided for the computing component, the temperature of the computing component.

8. A system comprising a processor having access to memory media storing instructions executable by the processor to:
identifying a computing device including at least one computing component and a cooling fan system;
detecting, by a thermal response module, a throttling of the computing component;
in response to detecting the throttling of the computing component:
identifying, by the thermal response module, a temperature of the computing component at a time of the throttling;
calculating, by the thermal response module, a thermal response for the computing component, including:
setting the identified temperature as a maximum temperature,
setting a first temperature lower than the maximum temperature, wherein for temperatures of the computing component less than the first temperature, the cooling fan system has a first fan speed,
setting a second temperature between the first temperature and the maximum temperature, wherein for temperatures of the computing component between the first and the second temperatures, a fan speed of the cooling fan system is linearly increased until an acoustic fan speed,
setting a third temperature between the second temperature and the maximum temperature, wherein for temperatures of the computing component between the second and third temperatures, maintaining the fan speed at the acoustic fan speed, and wherein for temperatures of the computing component greater than the third temperature, increasing the fan speed of the cooling system greater than the acoustic fan speed;
applying, by the thermal response module, the thermal response to the computing component.

9. The system of claim 8, the instructions further comprising:
after applying the thermal response to the computing component:
detecting, by the thermal response module, a further throttling of the computing component;
in response to detecting the further throttling of the computing component:
identifying, by the thermal response module, a further temperature of the computing component at a time of the further throttling;
calculating, by the thermal response module, a further thermal response for the computing component, including:
setting the identified further temperature as a further maximum temperature,
setting a further first temperature lower than the maximum temperature, wherein for temperatures of the computing component less than the further first temperature, the cooling fan system has the first fan speed, wherein the further first temperature is lower than the first temperature,
setting a further second temperature between the further first temperature and the further maximum temperature, wherein for temperatures of the computing component between the further first and the further second temperatures, the fan speed of the cooling fan system is linearly increased until the acoustic fan speed, wherein the further second temperature is lower than the second temperature,
setting a further third temperature between the further second temperature and the further maximum temperature, wherein for temperatures of the computing component between the further second and further third temperatures, maintaining the fan speed at the acoustic fan speed, wherein the further third temperature is lower than the third temperature, and wherein for temperatures of the computing component greater than the further third temperature, increasing the fan speed of the cooling system greater than the acoustic fan speed;
applying, by the thermal response module, the further thermal response to the computing component.

10. The system of claim 8, after applying the thermal response to the computing component, the operations further comprising ceasing to detect, by the thermal response module, a further throttling of the computing component within a time period.

11. The system of claim 8, wherein the first fan speed is an idle fan speed.

12. The system of claim 8, wherein the acoustic fan speed is based on acoustics of the computing device.

13. The system of claim 8, wherein identifying the temperature of the computing component includes:
providing, by the thermal response module to the computing component, a query of the temperature of the computing component; and
in response to the query, receiving, by the thermal response module and from the computing component, the temperature of the computing component.

14. The system of claim 8, wherein identifying the temperature of the computing component includes receiving, from one or more sensors provided for the computing component, the temperature of the computing component.

15. A non-transitory computer-readable medium storing software comprising instructions executable by one or more computers which, upon such execution, cause the one or more computers to perform operations comprising:
identifying a computing device including at least one computing component and a cooling fan system;
detecting, by a thermal response module, a throttling of the computing component;
in response to detecting the throttling of the computing component:
identifying, by the thermal response module, a temperature of the computing component at a time of the throttling;
calculating, by the thermal response module, a thermal response for the computing component, including:
setting the identified temperature as a maximum temperature,
setting a first temperature lower than the maximum temperature, wherein for temperatures of the computing component less than the first temperature, the cooling fan system has a first fan speed,
setting a second temperature between the first temperature and the maximum temperature, wherein for temperatures of the computing component between the first and the second temperatures, a fan speed of the cooling fan system is linearly increased until an acoustic fan speed, setting a third temperature between the second temperature and the maximum temperature, wherein for temperatures of the computing component between the second and third temperatures, maintaining the fan speed at the acoustic fan speed, and wherein for temperatures of the computing component greater than the third temperature, increasing the fan speed of the cooling system greater than the acoustic fan speed;

applying, by the thermal response module, the thermal response to the computing component.

16. The computer-readable medium of claim 15, the instructions further comprising:

after applying the thermal response to the computing component:

detecting, by the thermal response module, a further throttling of the computing component;

in response to detecting the further throttling of the computing component:

identifying, by the thermal response module, a further temperature of the computing component at a time of the further throttling;

calculating, by the thermal response module, a further thermal response for the computing component, including:

setting the identified further temperature as a further maximum temperature, setting a further first temperature lower than the maximum temperature, wherein for temperatures of the computing component less than the further first temperature, the cooling fan system has the first fan speed, wherein the further first temperature is lower than the first temperature, setting a further second temperature between the further first temperature and the further maximum temperature, wherein for temperatures of the computing component between the further first and the further second temperatures, the fan speed of the cooling fan system is linearly increased until the acoustic fan speed, wherein the further second temperature is lower than the second temperature, setting a further third temperature between the further second temperature and the further maximum temperature, wherein for temperatures of the computing component between the further second and further third temperatures, maintaining the fan speed at the acoustic fan speed, wherein the further third temperature is lower than the third temperature, and wherein for temperatures of the computing component greater than the further third temperature, increasing the fan speed of the cooling system greater than the acoustic fan speed;

applying, by the thermal response module, the further thermal response to the computing component.

17. The computer-readable medium of claim 15, after applying the thermal response to the computing component, the operations further comprising ceasing to detect, by the thermal response module, a further throttling of the computing component within a time period.

18. The computer-readable medium of claim 15, wherein the first fan speed is an idle fan speed.

19. The computer-readable medium of claim 15, wherein the acoustic fan speed is based on acoustics of the computing device.

20. The computer-readable medium of claim 15, wherein identifying the temperature of the computing component includes:

providing, by the thermal response module to the computing component, a query of the temperature of the computing component; and in response to the query, receiving, by the thermal response module and from the computing component, the temperature of the computing component.

* * * * *